(12) United States Patent
Athas et al.

(10) Patent No.: US 7,436,196 B2
(45) Date of Patent: Oct. 14, 2008

(54) METHOD AND APPARATUS FOR MEASURING DIE-LEVEL INTEGRATED CIRCUIT POWER VARIATIONS

(75) Inventors: William C. Athas, San Jose, CA (US); Herbert Lopez-Aguado, Sunnyvale, CA (US); Thomas Y. Ho, Fremont, CA (US)

(73) Assignee: Apple Inc., Cupertino, CA (US)

( * ) Notice: Subject to any disclaimer, the term of this patent is extended or adjusted under 35 U.S.C. 154(b) by 115 days.

(21) Appl. No.: 11/354,721

(22) Filed: Feb. 15, 2006

(65) Prior Publication Data

US 2007/0188184 A1    Aug. 16, 2007

(51) Int. Cl.
*G01R 31/02* (2006.01)

(52) U.S. Cl. ...................................................... 324/763

(58) Field of Classification Search ................ 324/763; 714/22
See application file for complete search history.

(56) References Cited

U.S. PATENT DOCUMENTS

| | | | |
|---|---|---|---|
| 5,793,126 A | * | 8/1998 | Gray .......................... 307/125 |
| 5,864,506 A | * | 1/1999 | Arcoleo et al. .......... 365/189.05 |
| 2001/0013790 A1 | * | 8/2001 | Kusumoto .................... 324/765 |
| 2004/0066209 A1 | * | 4/2004 | Beer et al. .................... 324/763 |
| 2004/0179624 A1 | * | 9/2004 | Deas et al. .................... 375/259 |
| 2005/0093561 A1 | * | 5/2005 | Watanabe et al. ............ 324/763 |

* cited by examiner

*Primary Examiner*—Ha Nguyen
*Assistant Examiner*—Joshua Benitez
(74) *Attorney, Agent, or Firm*—Park, Vaughan & Fleming LLP

(57) ABSTRACT

A system that determines power consumption on an IC chip. The system includes a test structure located within the IC chip variations which includes one or more gates which receives power from a power source, wherein each gate has a different drive strength, and wherein the output of each gate is coupled to a load through a corresponding switch. The system also includes a current-measuring mechanism coupled to the power supply which measures the current consumed by the gates. When a specific switch is activated, the output of a corresponding gate is coupled to the load, thereby causing the corresponding gate to drive the load. The current consumed by the corresponding gate is measured by the current measuring mechanism. The measured current can be used to determine the power consumption of the corresponding gate driving the load.

18 Claims, 5 Drawing Sheets

METHOD AND APPARATUS FOR MEASURING DIE-LEVEL INTEGRATED CIRCUIT POWER VARIATIONS

BACKGROUND

1. Field of the Invention

The present invention relates to techniques for accurately determining power consumption within an integrated circuit (IC) chip. More specifically, the present invention relates to a method and apparatus for determining power consumption in an IC chip by using one or more test structures located on the IC chip.

2. Related Art

Because of manufacturing variations, ICs exhibit differences in their device-level power-consumption characteristics which are caused by differences in parasitic capacitances and resistances, and differences in the performance between the n-channel and p-channel field effect transistors (n-FETs and p-FETs).

More specifically, dynamic power dissipation and static power dissipation can vary between ICs that are identically designed because of differences introduced during fabrication. These variations affect both static and dynamic power dissipation. Note that dynamic power dissipation is often a significant portion of the overall power dissipation. The manufacturing variations that affect dynamic power dissipation are subtle and include:

1. vertical distance between the wiring layers;
2. dielectric constant for the field oxide;
3. dielectric constant for the gate oxide;
4. gate-oxide thickness;
5. threshold voltages for the n-FETs and p-FETs;
6. carrier mobility for the n-FETs and p-FETs;
7. channel length for the n-FETs and p-FETs; and
8. cross-sectional wire area.

There are two major components of dynamic power consumption: capacitive charging/discharging power and short-circuit power. Many of the above-mentioned variations result in a change in the driven capacitance for a circuit node, which affects capacitive charging/discharging power. Note that the power required to charge and discharge a capacitance, C, is given by:

$$P_{cap} = FCV^2$$

where F is the frequency and V is the voltage potential across the capacitor. As can be inferred from this equation, changes in capacitance will cause corresponding changes in capacitive charging/discharging power.

Short-circuit power dissipation is caused by current that flows directly from the power-supply rail to the ground rail during the switching of a circuit node between logical states (for example, a transition from a high state to a low state), is given by:

$$P_{sc} = F \frac{\beta}{12}(V_{dd} - V_{th})^3 t_{rf}$$

(See Neil H. E. Weste and Kamran Eshraghian, *Principles of CMOS VLSI Design—A Systems Perspective, Second Edition*, Addison-Wesley Publishing Company, 1993.)

FIG. 1 presents a voltage-versus-time graph illustrating several factors affecting short-circuit power consumption. First, variations in the threshold voltage for the p-FETs and n-FETs ($V_{thp}$ and $V_{thn}$) increases or decreases the time interval when both the n-FETs and the p-FETs conduct. Likewise, longer rising or falling edge times ($t_{rf}$) also extends the amount of time that both the n-FET and the p-FET conduct.

For a fixed supply voltage, an IC that can be clocked at a higher frequency typically has a smaller threshold voltage than an IC that must be clocked at a lower frequency. A small threshold voltage increases the interval in FIG. 1 when both n-FET and p-FET devices are conducting. Slow devices have longer rise and fall times which also increase the duration of interval when both types of devices conduct.

Mismatched stages of logic, in which an undersized stage drives an oversized stage, can cause the "both on" region to increase for the oversized stage. This is because the slow-rising or slow-falling edge output from the undersized stage causes excess power dissipation in the oversized stage. For example, FIGS. 2A, 2B, and 2C illustrate circuit topologies that cause slow-rising and slow-falling edges, which thereby contribute to larger short-circuit power dissipation. More specifically, FIG. 2A illustrates a small driver driving a large driver, FIG. 2B illustrates a driver driving extra capacitance, and FIG. 2C illustrates a driver driving extra resistance between logic stages.

Static-power dissipation can be determined by applying power to an IC with all of its clock-circuit outputs turned off. The resulting power dissipation (derived from the quiescent IDDQ current) is a measure of the static power dissipation of the IC and can be further parametrically refined by taking measurements at different temperatures and at different supply voltages. Unfortunately, dynamic power consumption cannot be parametrically measured during normal operation of an IC using existing techniques.

Hence, what is needed is a method and an apparatus for determining the power consumption variations of an IC chip without the problems described above.

SUMMARY

One embodiment of the present invention provides a system that determines power consumption on an IC chip. The system includes a test structure located within the IC chip which includes one or more gates which receives power from a power supply, wherein each gate has a different drive strength, and wherein the output of each gate is coupled to a load through a corresponding switch. The system also includes a current-measuring mechanism coupled to the power supply which measures the current consumed by the gates. When a specific switch is activated, the output of a corresponding gate is coupled to the load, thereby causing the corresponding gate to drive the load. The current consumed by the corresponding gate is measured by the current-measuring mechanism. This measured current can be used to determine the power consumption of the corresponding gate driving the load.

In a variation on this embodiment, the system includes a modeling method which produces parameters for a model for the dynamic power consumption of the IC chip. Parameters for the model are determined by measuring the power consumed by test structures at specific locations within the IC chip. Note that to determine the parameters, the system varies: (1) the gate size by activating switches to select a gate of a desired size; (2) the rise and fall times of the input signal applied to the selected gate; (3) the voltage level of the input signal applied to the selected gate; (4) the temperature of the IC chip; and (5) the load attached to the test structure.

In a variation on this embodiment the load is a "wire load," which provides the resistance and the capacitance of a representative wire coupled to the output of the test structure.

In a variation on this embodiment, the load is a "logic load," which provides the capacitive load of one or more representative logic gates which are coupled to the output of the test structure.

In a variation on this embodiment, the current-measuring mechanism measures current consumption during normal operation of the IC chip.

In a variation on this embodiment, the test structure is placed substantially close to a functional unit within the IC chip so that the current consumption measured by the test structure can be used to estimate the power consumption variation of the functional unit.

In a variation on this embodiment, the current-measuring mechanism is located on the IC chip.

In a variation on this embodiment, the current-measuring mechanism is located off-chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

The present invention determines the power dissipation of an IC by measuring the power consumption characteristics of on-chip test structures. These on-chip test structures are designed to individually evaluate the physical parameters which affect power consumption of the IC. This makes it possible to determine whether the IC will be a high-power component or a low-power component.

Power-Consumption Test Structures

Figure 1:
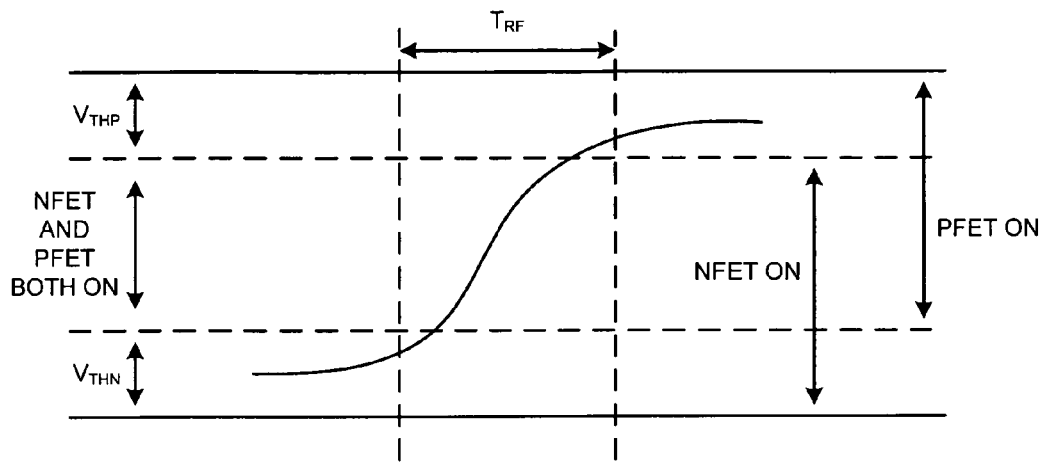
FIG. 1 presents a voltage-versus-time graph illustrating several factors affecting short-circuit power consumption.
Figure 2A:
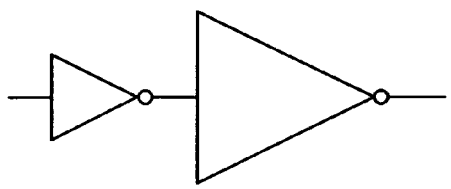
FIG. 2A illustrates a small driver which drives a large driver, thereby causing slow-rising edges and slow-falling edges.
Figure 2B:
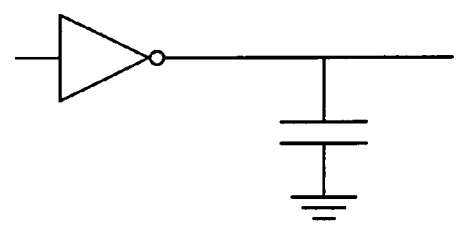
FIG. 2B illustrates a driver driving extra capacitance, which causes slow-rising edges and slow-falling edges.
Figure 2C:
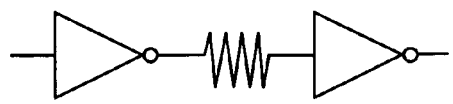
FIG. 2C illustrates a driver driving extra resistance between logic stages, which causes slow-rising edges and slow-falling edges.
Figure 3A:
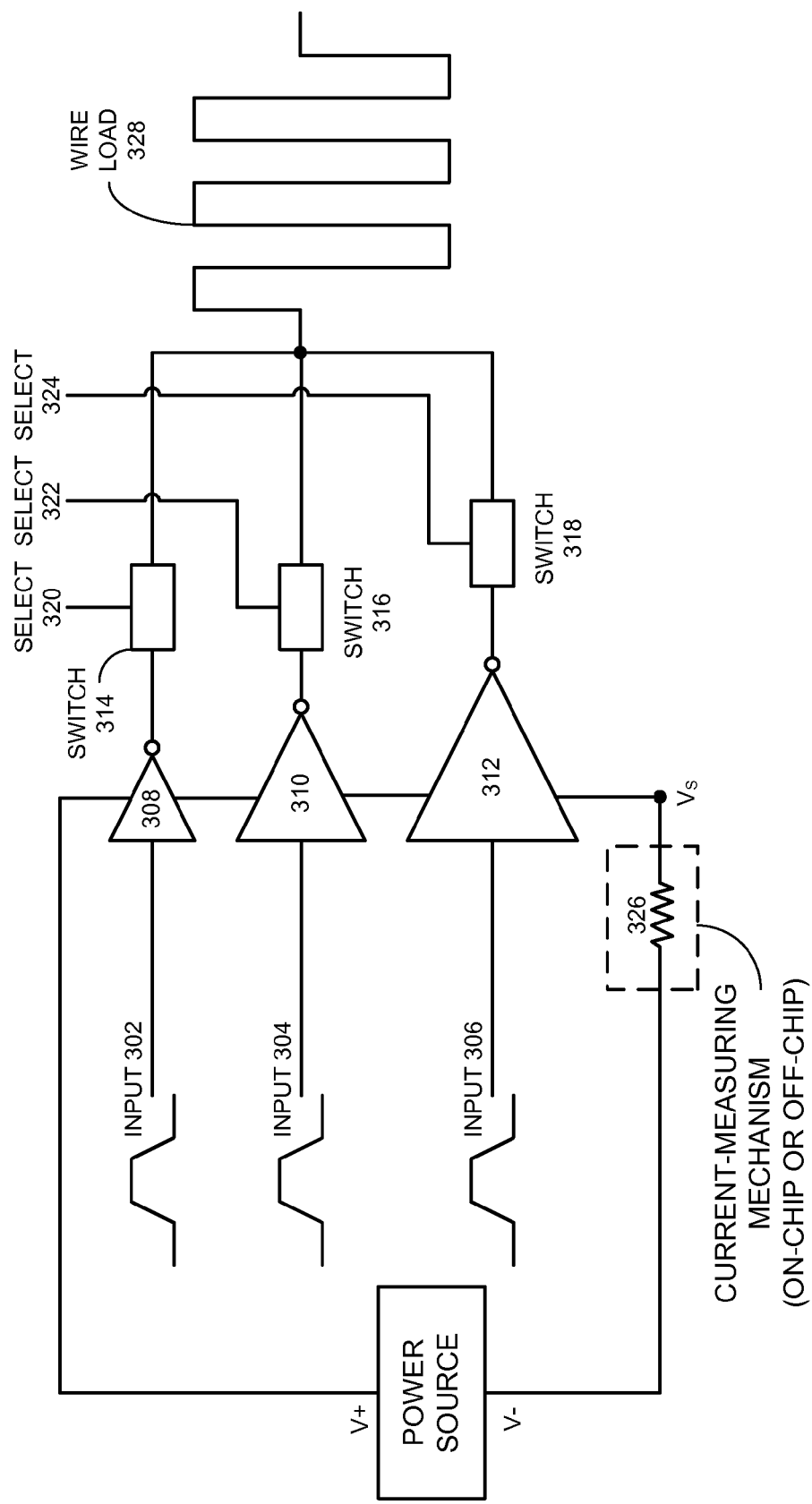
FIG. 3A presents a block diagram of a test structure with a wire load in accordance with an embodiment of the present invention.

FIG. 3A presents a block diagram of a test structure with a representative wire load in accordance with an embodiment of the present invention. It contains inverters 308, 310, and 312, switches 314, 316, and 318, select lines 320, 322, 324, resistor 326, and wire load 328. This test structure can be used to evaluate the factors affecting short-circuit power consumption and to determine how dynamic power dissipation varies from the nominal design point for an IC.

While measuring the power consumed by the test structure, the input-waveform voltage, the power-supply voltage, the driver size, and the load can be varied to determine the power consumption characteristics of a given IC.

For example, input stimuli, such as trapezoidal waveforms, are applied to inputs 302, 304, and 306 of inverters 308, 310, and 312, respectively. Note that the terminals V+ and V− are separately powered from the other power supplies used by the IC. The outputs of inverters 308, 310, and 312 are tied to analog switches 314, 316, and 318, respectively, which, in turn, are connected to a common wiring structure which provides a wire load 328. The purpose of the common wiring structure is to provide a representative wire load comprising mostly of distributed wiring capacitance and resistance. Note that the channel lengths for the gate nodes of the n-FETs and p-FETs of the inverters 308, 310, and 312 are scaled with the overall drive strength set to different levels corresponding with the drive strengths used elsewhere on the IC. With this arrangement, the current can be measured using the following sequence of operations:

1. Analog switch 314 is closed and switches 316 and 318 are left open.
2. Inputs 304 and 306 are held at a constant voltage level between V+ and V− inclusively.
3. Current is measured by sweeping the input 302 signal using different rise and fall times and by sweeping different voltage potentials across V+ and V−.

The above operations are similarly repeated with switch 316 closed, switches 314 and 318 open, and inputs 302 and 306 held constant while input 304 is varied. They are also repeated while switch 318 is closed, switches 314 and 316 are open, and inputs 302 and 304 are held constant while input 306 is varied. Although three inverters and three analog switches are used in the embodiment illustrated in FIG. 3A, other embodiments may use other numbers of inverter and corresponding switch combinations. By using the structure illustrated in FIG. 3A, both the dynamic power for driving wiring resistance and capacitance and the effects of short-circuit current upon dynamic power can be evaluated.

Note that resistor 326 at the bottom of FIG. 3A is used to measure the current consumed by inverters 308, 310, and 312 by sensing the voltage drop across resistor 326 (i.e. the voltage drop across $V_S$ and V−). Also note that resistor 326 can be replaced by any other current-measuring device, located on-chip or off-chip.

Although inverters are used in the test structure illustrated in FIG. 3A to drive the loads, other gate types can be used as drivers. For example, NAND, NOR, AND, or OR gates can be used.

Figure 3B:
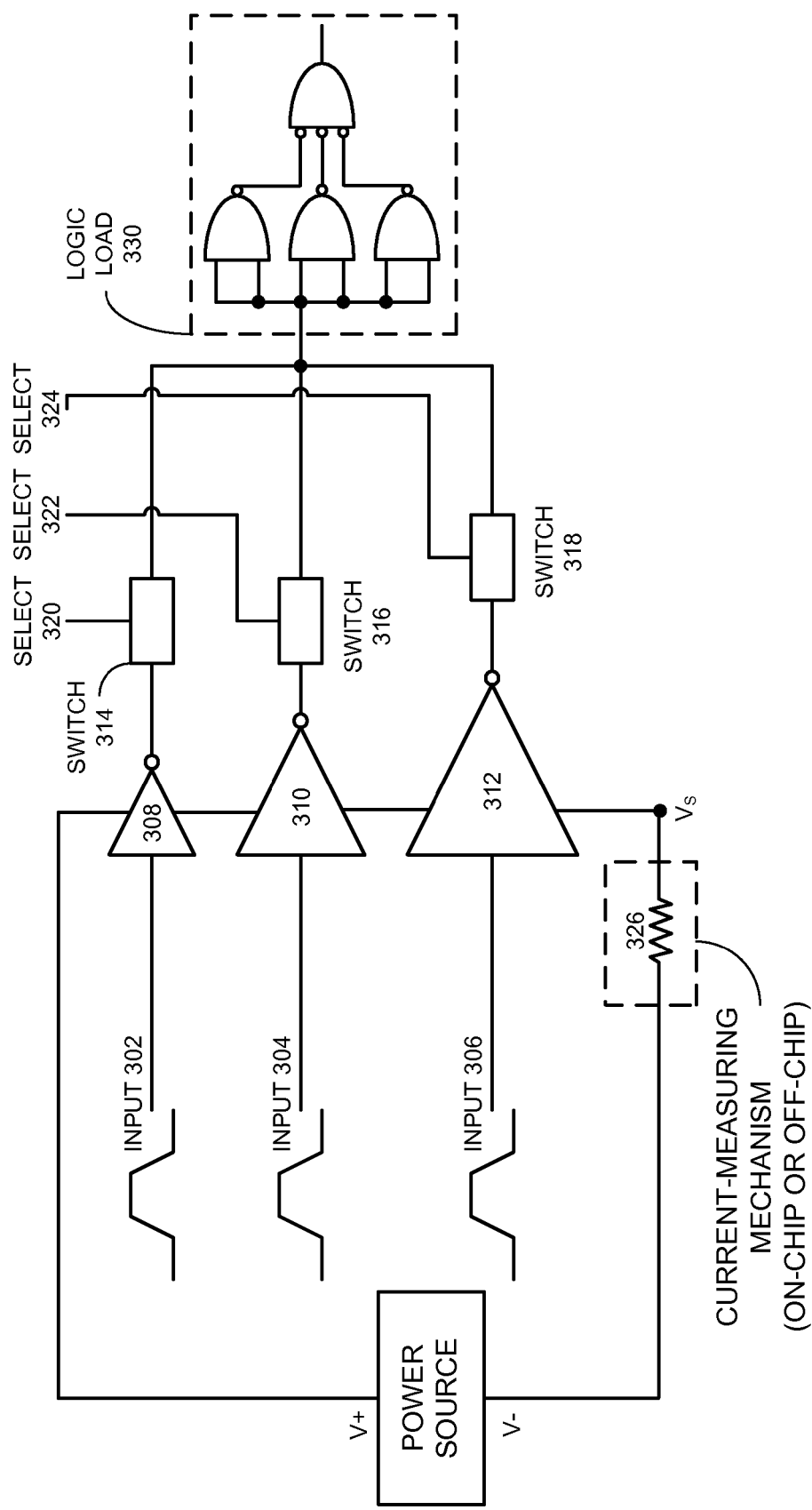
FIG. 3B presents a block diagram of a test structure with a logic load in accordance with an embodiment of the present invention.

FIG. 3B presents a block diagram of a similar test structure with a logic load in accordance with an embodiment of the present invention. The test structure illustrated in FIG. 3B can be used to determine the effect of gate and parasitic capacitance on dynamic power dissipation. The outputs of inverters 308, 310, and 312 are tied to analog switches 314, 316, and 318, respectively, which, in turn, are connected to combinational logic network 330. Note that although NAND gates are shown in the embodiment, other gate combinations can be used. The measurement of current follows the same sequence as that for the test structure illustrated in FIG. 3A.

Figure 4:
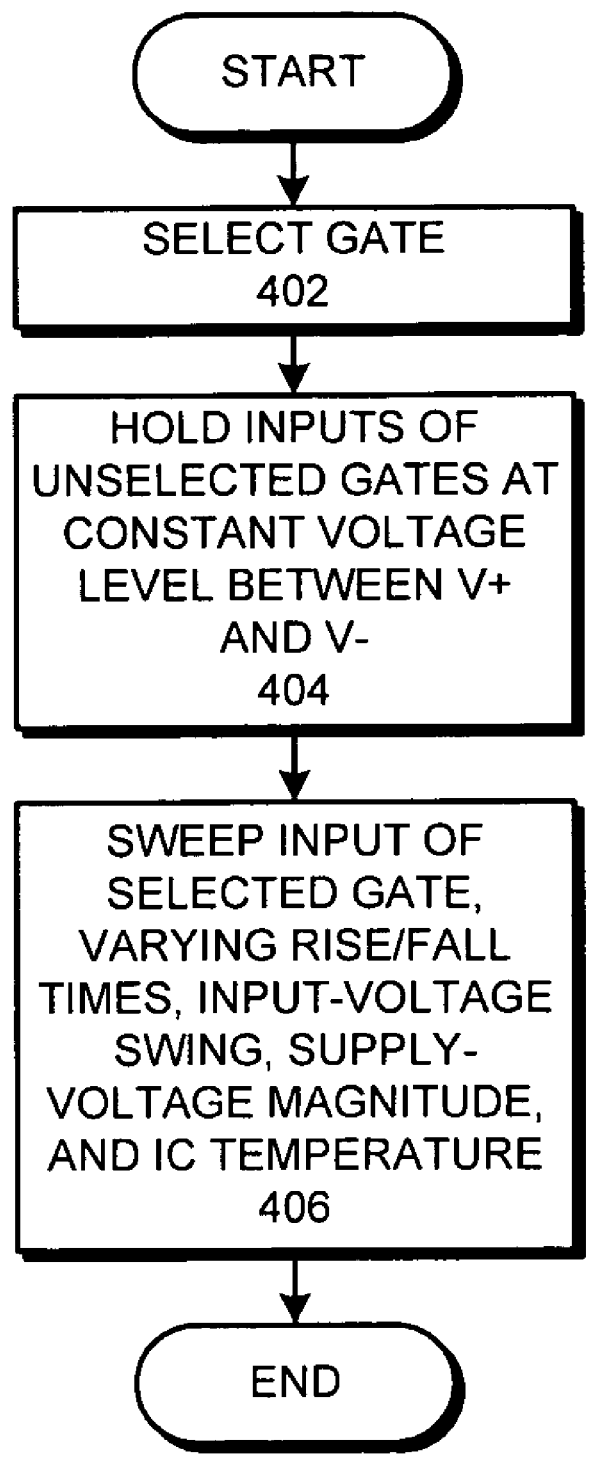
FIG. 4 presents a flow chart illustrating the process of using a test structure located on an IC chip to measure the power consumption in the IC chip in accordance with an embodiment of the present invention.

FIG. 4 presents a flowchart illustrating the process of using a test structure located within an IC chip to measure power consumption within the IC chip in accordance with an embodiment of the present invention. The process begins when the system selects a gate with a specific driver size by closing one switch and leaving the other switches open (step 402). While doing so, the system holds the inputs for the unselected gates to a constant voltage between V+ and V− (step 404). The system then sweeps the input of the selected gate and while doing so, varies the rise and fall times, the input-voltage swing, the supply voltage magnitude, and the temperature of the IC (step 406).

Figure 3C:
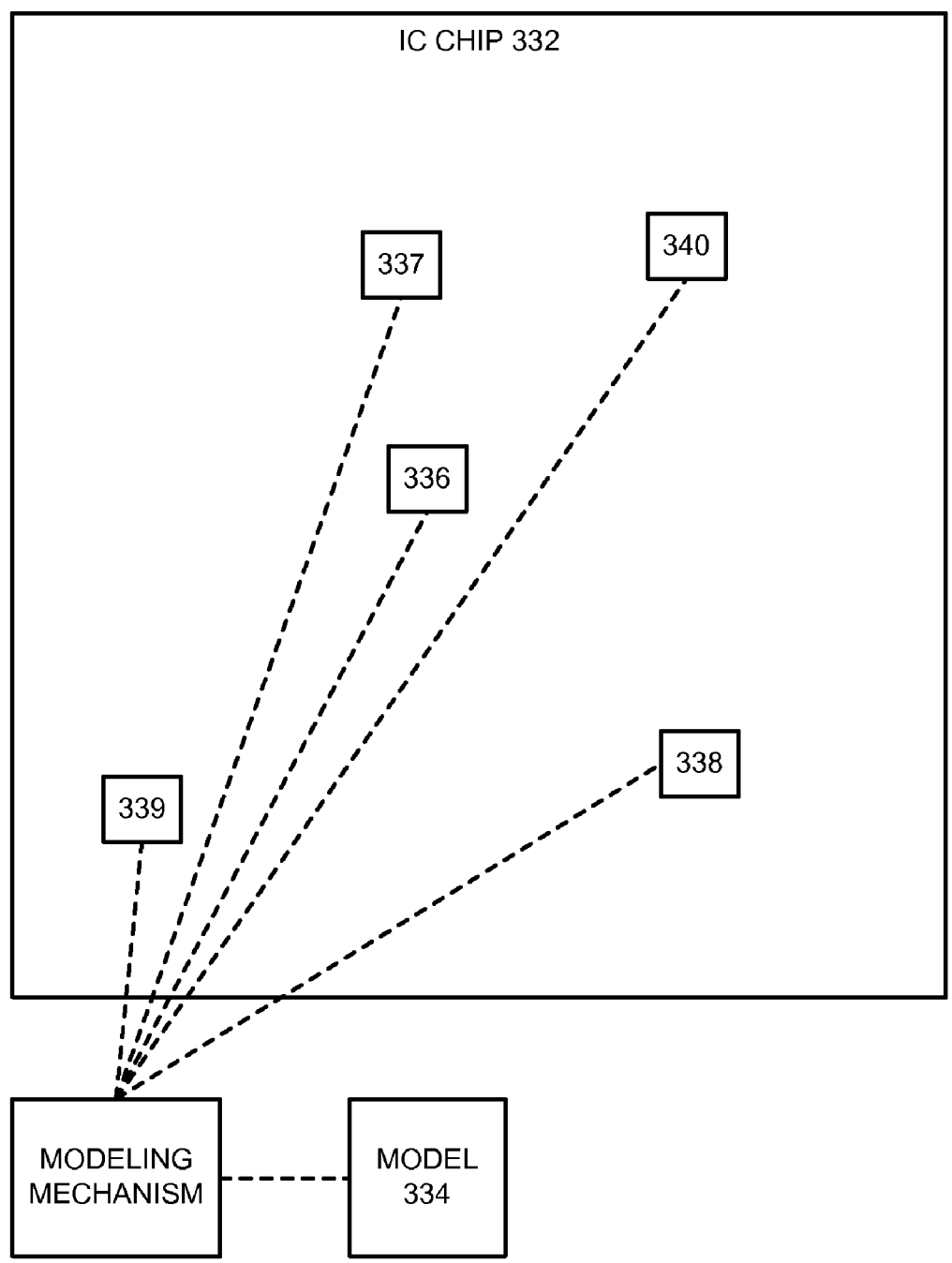
FIG. 3C presents a block diagram illustrating a modeling mechanism in accordance with an embodiment of the present invention. load in accordance with an embodiment of the present invention.

In one embodiment of the present invention, the current measurements are fit to a model (e.g. model 334 in FIG. 3C) for the dynamic power consumption of the IC chip (e.g. model 332 in FIG. 3C). Parameters for this model are determined by measuring the power consumed by test structures (e.g. model 336-334 in FIG. 3C) at specific locations within the IC chip. In doing so, the system varies: (1) the gate size (i.e. driver size) by activating specified switches; (2) the rise and fall times of the input signal applied to the selected gate; (3) the voltage level of the input signal applied to the selected gate; (4) the temperature of the IC chip; (5) the load attached to the test structure. Note that varying the load attached to the test structure can include varying the load size (i.e., the length, width, or the number and type of logic gates attached) or the load type (i.e. wire load versus logic load).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that measures power consumption within an integrated circuit chip, comprising:
    a test structure located on the integrated circuit chip which includes:
        one or more gates which receive power from a power source, wherein each gate has a different drive strength;
        wherein the output of each gate is coupled to a load through a corresponding switch;
    a current-measuring mechanism coupled to the power source which measures the current consumed by the gates;
    wherein when a specific switch is activated, the output of a corresponding gate is coupled to the load, thereby causing the corresponding gate to drive the load, wherein the current consumed by the corresponding gate is measured by the current-measuring mechanism, and wherein the measured current can be used to determine the power consumption of the corresponding gate while driving the load; and
    a modeling mechanism which produces parameters for a model for the dynamic power consumption of the integrated circuit chip by measuring the power consumed by test structures at specific locations within the integrated circuit chip.

2. The apparatus of claim 1, wherein the load is a representative "wire load," which provides the resistance and the capacitance of a wire coupled to the output of the test structure.

3. The apparatus of claim 1, wherein the load is a representative "logic load," which provides the capacitive load of one or more logic gates which are coupled to the output of the test structure.

4. The apparatus of claim 1, wherein the current-measuring mechanism measures current consumption during normal operation of the integrated circuit chip.

5. The apparatus of claim 1, wherein the current-measuring mechanism is located on the integrated-circuit chip.

6. The apparatus of claim 1, wherein the current-measuring mechanism is located off chip.

7. The apparatus of claim 1,
    wherein a gate of a desired size is selected by activating specified switches;
    wherein the rise and fall times of the input signal applied to the selected gate are varied;
    wherein the voltage level of the input signal applied to the selected gate is varied;
    wherein the temperature of the integrated circuit chip is varied; and
    wherein the load attached to the test structure is varied.

8. A method for measuring power consumption within an integrated circuit chip, wherein the integrated circuit chip includes a test structure, wherein the test structure includes one or more gates coupled to a power source, wherein each gate has a different drive strength, and wherein the output of each gate is coupled to a load through a corresponding switch, wherein the method comprises:
    activating a specific switch in the test structure to couple the output of a corresponding gate to the load;
    applying a voltage waveform to the input of the corresponding gate, thereby causing the corresponding gate to draw current from the power source while driving the load;
    using a current-measuring mechanism coupled to the power source to measure the current consumed by the corresponding gate; and
    using the measured current to determine the power consumption of the corresponding gate while driving the load; and
    producing parameters for a model for the dynamic power consumption of the integrated circuit chip by measuring the current consumed by test structures at specific locations within the integrated circuit chip;

9. The method of claim 8, wherein the load is a "wire load," which provides the resistance and the capacitance of a wire coupled to the output of the test structure.

10. The method of claim 8, wherein the load is a "logic load," which provides the capacitive load of one or more logic gates which are coupled to the output of the test structure.

11. The method of claim 8, wherein the current-measuring mechanism measures current consumption during normal operation of the integrated circuit chip.

12. The method of claim 8, wherein the current-measuring mechanism is located on the integrated-circuit chip.

13. The method of claim 8, wherein the current-measuring mechanism is located off-chip.

14. The method of claim 8, wherein the method further comprises:
    selecting a gate of a desired size by activating specified switches;
    varying the rise and fall times of the input signal applied to the selected gate;

varying the voltage level of the input signal applied to the selected gate;

varying the temperature of the integrated circuit chip; and varying the load attached to the test structure.

15. A computer system that determines power consumption within an integrated circuit chip, comprising:

a test structure located on the integrated circuit chip which includes:

one or more gates which receives power from a power source, wherein each gate has a different drive strength;

wherein the output of each gate is coupled to a load through a corresponding switch; and a current-measuring mechanism coupled to the power source which measures the current consumed by the gates;

wherein when a specific switch is activated, the output of a corresponding gate is coupled to the load, thereby causing the corresponding gate to drive the load, wherein the current consumed by the corresponding gate is measured by the current-measuring mechanism, and wherein the measured current can be used to determine the power consumption of the corresponding gate while driving the load;

a modeling mechanism which produces parameters for a model for the dynamic power consumption of the integrated circuit chip by measuring the current consumed by test structures at specific locations within the integrated circuit chip;

16. The computer system of claim 15, wherein the load is a "wire load," which provides the resistance and the capacitance of a wire coupled to the output of the test structure.

17. The computer system of claim 15, wherein the load is a "logic load," which provides the capacitive load of one or more logic gates which are coupled to the output of the test structure.

18. The computer system of claim 15, wherein a gate of a desired size is selected by activating specified switches;

wherein the rise and fall times of the input signal applied to the selected gate are varied;

wherein the voltage level of the input signal applied to the selected gate is varied;

wherein the temperature of the integrated circuit chip is varied; and wherein the load attached to the test structure is varied.

* * * * *